United States Patent [19]
Wasson

[11] Patent Number: 6,161,206
[45] Date of Patent: Dec. 12, 2000

[54] PATTERN GENERATOR FOR A SEMICONDUCTOR INTEGRATED CIRCUIT TESTER

[75] Inventor: Timothy M. Wasson, Portland, Oreg.

[73] Assignee: Credence Systems Corporation, Fremont, Calif.

[21] Appl. No.: 09/071,385

[22] Filed: Apr. 30, 1998

[51] Int. Cl.[7] .................................................. G01R 31/28
[52] U.S. Cl. ........................................................ 714/738
[58] Field of Search ................................... 714/738, 718, 714/719, 703, 801, 724

[56] References Cited

U.S. PATENT DOCUMENTS

| | | | |
|---|---|---|---|
| 4,369,511 | 1/1983 | Kimura et al. | 714/718 |
| 4,531,213 | 7/1985 | Scheuneman | 714/703 |
| 4,555,663 | 11/1985 | Shimizu | 714/738 |
| 4,759,021 | 7/1988 | Kawaguchi et al. | 714/738 |
| 5,018,145 | 5/1991 | Kikuchi et al. | 714/738 |
| 5,265,102 | 11/1993 | Saito | 714/738 |
| 5,796,748 | 8/1998 | Housako et al. | 714/738 |
| 5,856,985 | 1/1999 | Fujisaki | 714/738 |
| 5,883,905 | 3/1999 | Eastburn | 714/738 |
| 5,923,678 | 7/1999 | Ishibashi | 714/738 |

*Primary Examiner*—Albert De Cady
*Assistant Examiner*—Shelly A Chase
*Attorney, Agent, or Firm*—John Smith-Hill; Smith-Hill and Bedell

[57] ABSTRACT

A test pattern generator for a semiconductor integrated circuit tester comprises a DRAM for receiving and storing test pattern data in blocks and a SRAM for storing checking data in units, wherein each unit of checking data stored in the SRAM bears a predetermined relationship to a corresponding block received by the DRAM. A DRAM sequencer addresses the DRAM for reading the blocks of test pattern data in a predetermined order and a SRAM sequencer addresses the SRAM for reading the units of checking data from the SRAM. A validating circuit receives a block of test pattern data read from the DRAM and the corresponding unit of checking data read from the SRAM and provides an output which indicates whether the unit of checking data is in the predetermined relationship with the block.

31 Claims, 3 Drawing Sheets

PATTERN GENERATOR FOR A SEMICONDUCTOR INTEGRATED CIRCUIT TESTER

BACKGROUND OF THE INVENTION

This invention relates to a pattern generator for a semiconductor integrated circuit tester.

A conventional semiconductor integrated circuit (IC) tester has a separate channel for each pin of a device under test (DUT). A typical tester channel includes a pin electronics circuit having a tester pin which engages a pin of the DUT. The tester organizes an IC test into a succession of test cycles, and during each test cycle, each channel uses its pin electronics circuit either to send a stimulus signal to its DUT pin or to monitor a response signal at the DUT pin to determine if the DUT is behaving as expected.

Operation of the tester is controlled by a host computer which generates, for each test cycle, a test pattern for each channel. Typically, the test pattern is a 4-bit word. The test pattern is supplied to the pin electronics circuit to establish the state of the pin electronics circuit on the next test cycle. The typical test channel also includes a test pattern memory into which the test patterns are loaded prior to test execution and a sequencer which generates a sequence of addresses for reading the test patterns from the test pattern memory and supplying the test patterns to the pin electronics circuit in the proper order.

Traditionally, the test pattern memory has been implemented using SRAM. However, Saito, U.S. Pat. No. 5,265,102, shows a test pattern generator for a semiconductor integrated circuit tester in which the test pattern memory is implemented using DRAM. Use of DRAM in the test pattern memory is advantageous because it is less expensive than SRAM. However, DRAM is subject to the disadvantage that the contents of the DRAM must be refreshed and readout of the test pattern must be suspended during the refresh interval. Accordingly, in order to accommodate use of DRAM to implement the test pattern memory, the test patterns are read from the DRAM in blocks of several test patterns at a time. The blocks are temporarily stored in an interface circuit, such as a FIFO memory, and are supplied to the pin electronics circuit in the proper order and with the proper timing.

An error can be induced in the data stored in a DRAM chip by interaction with alpha particles generated in the DRAM packaging material. The data remains incorrect until the correct data is rewritten by reloading the memory with the proper test pattern data from the host computer. This type of error is known as a soft error. The probability of occurrence of a soft error in a single DRAM chip is quite small. However, if a semiconductor integrated circuit tester uses a relatively large number of DRAM chips for the test pattern memory, soft errors can become statistically significant. For example, if the tester has 512 device pins and four DRAM chips per device pin, the tester includes over 2,000 DRAM chips. If each DRAM chip has a single bit soft error rate of 94 failures per billion hours of operation, reasonably conservative calculations show that there is approximately a 3 percent per day probability of incurring a soft error.

Since soft errors in DRAMs are caused by random external events, the frequency with which the correct memory data is loaded into the DRAM does not affect the probability of a soft error, although it may affect its impact.

Many IC testers are used in a production environment, in which a test pattern is loaded into the test pattern memory followed by days of test program execution. An undiscovered error in a test pattern could compromise the test results for an entire production run of integrated circuit devices. If there is a significant change in device yield, the operator may recognize the possibility of a soft error and take suitable remedial action, such as reloading the test pattern memory and retesting devices. However, a soft error might cause a small change in device yield, which might not be noticed. In this case, faulty devices may be classified as good and shipped to customers, or good devices may be classified as faulty and discarded as scrap.

SUMMARY OF THE INVENTION

In accordance with a first aspect of the invention there is provided a test pattern generator for a semiconductor integrated circuit tester, comprising a first read/write memory for receiving and storing test pattern data in a plurality of blocks, a second read/write memory for storing checking data in a plurality of units, wherein each unit of checking data stored in the second read/write memory bears a predetermined relationship to a corresponding block received by the first read/write memory, at least one sequencer for addressing the first read/write memory for reading the blocks of test pattern data in a predetermined order and addressing the second read/write memory for reading the units of checking data from the second read/write memory, and a validating means for receiving a block of test pattern data read from the first read/write memory and the corresponding unit of checking data read from the second read/write memory and providing an output which indicates whether the unit of checking data is in said predetermined relationship with the block.

In accordance with a second aspect of the invention there is provided a test pattern generator for a semiconductor integrated circuit tester, comprising at least first and second test pattern generator modules each including a pattern read/write memory for receiving and storing test pattern data in a plurality of blocks, a check read/write memory for storing checking data in a plurality of units, wherein each unit of checking data stored in the check read/write memory bears a predetermined relationship to all the blocks stored at corresponding addresses of the pattern read/write memory of each test pattern generator module, at least one sequencer for addressing the pattern read/write memories of the first and second test pattern generator modules each in the same order for reading blocks of test pattern data and for addressing the check read/write memory in the same order as the pattern read/write memories for reading units of checking data from the corresponding addresses of the check read/write memory, a validating means for receiving a unit read from an address of the check read/write memory and blocks of test pattern data read from corresponding addresses of the pattern read/write memory of each test pattern generator module and providing an output which indicates whether the unit is in said predetermined relationship with the blocks.

In accordance with a third aspect of the invention there is provided a method of operating a semiconductor integrated circuit tester which includes a test pattern generator comprising a first read/write memory for storing test pattern data in a plurality of blocks, said method comprising supplying test pattern data to the first read/write memory in a plurality of blocks, reading the blocks of test pattern data from the first read/write memory in a predetermined order, providing checking data in a plurality of units, wherein each unit bears a predetermined relationship to a corresponding block supplied to the first read/write memory, comparing each block of test pattern data read from the read/write memory with the corresponding unit of the checking data, and providing an output which indicates whether the unit of the checking data is in said predetermined relationship with the corresponding block of test pattern data.

In accordance with a fourth aspect of the invention there is provided a method of operating an electronic instrument including DRAM, said method comprising supplying data to the DRAM in a plurality of blocks, reading the blocks of data from the DRAM in a predetermined order, providing checking data in a plurality of units, wherein each unit bears a predetermined relationship to a corresponding block supplied to the DRAM, comparing each block of data read from the DRAM with the corresponding unit of the checking data, and providing an output which indicates whether the unit of the checking data is in said predetermined relationship with the corresponding block of data read from the DRAM.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
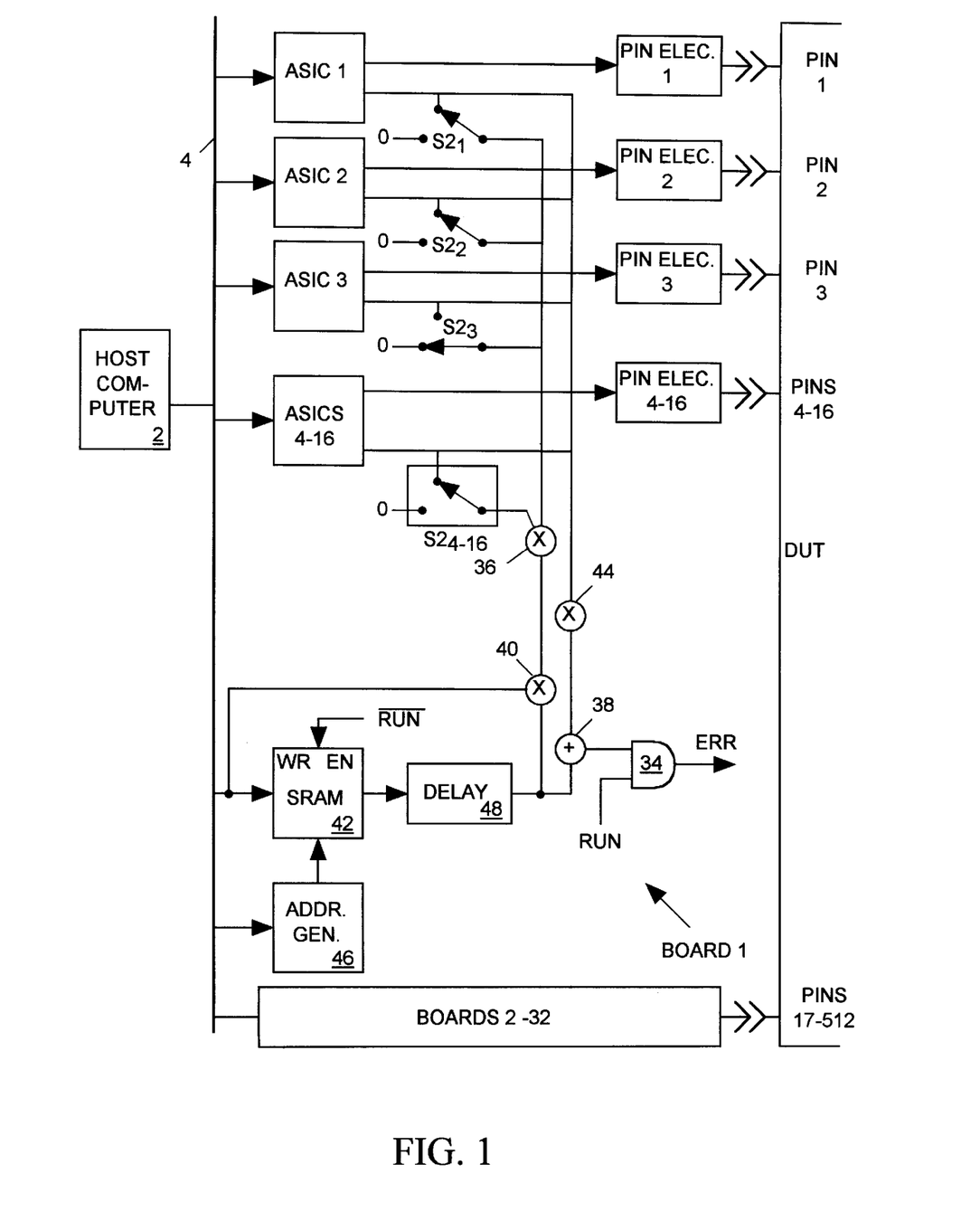
FIG. 1 is a schematic block diagram illustrating a semiconductor integrated circuit tester including a first test pattern generator in accordance with the present invention.
Figure 2:
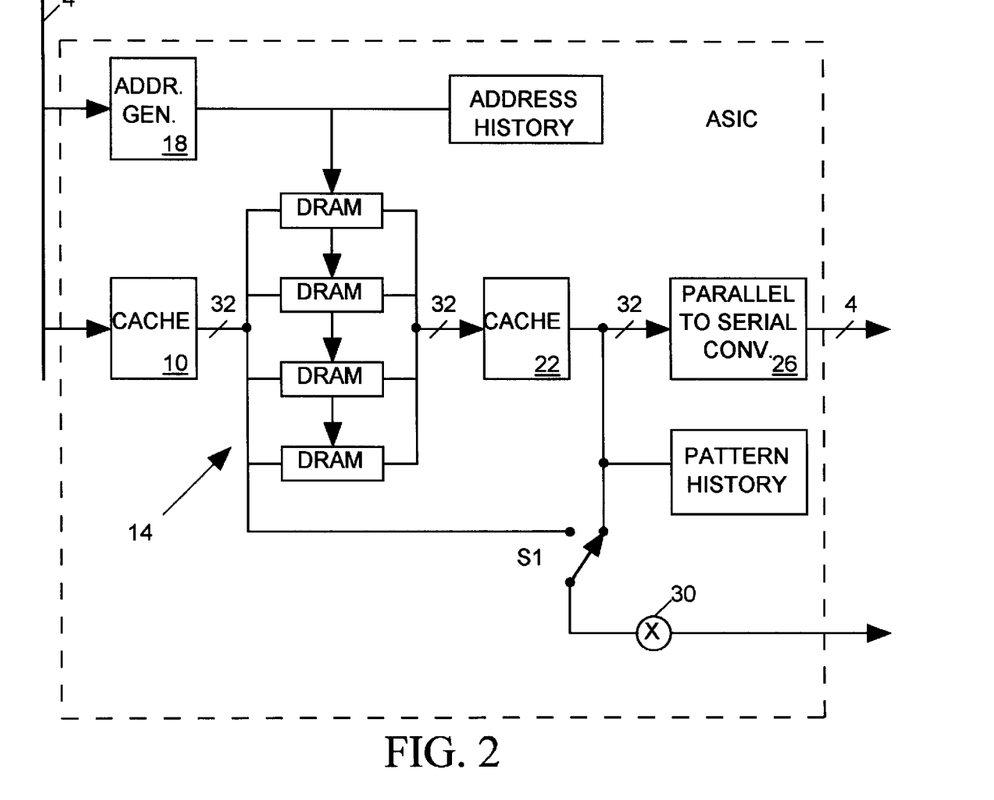
FIG. 2 is a schematic block diagram of an application specific integrated circuit (ASIC) that forms part of the tester shown in FIG. 1.

The IC tester illustrated in FIGS. 1 and 2 includes a host computer 2 which communicates over a data bus 4 with 512 tester channels terminating in 512 tester pins respectively. The tester may therefore be used for testing a device having up to 512 pins. For present purposes, the tester has two modes of operation, which are referred to herein as memory load and test execution. The host computer generates a signal RUN, which is high during test execution and is low during memory load. During memory load, the host computer 2 generates 4-bit test patterns for each channel and supplies the test patterns to the channels over the data bus 4. Subsequently, during test execution, the channels supply the test patterns to their respective pin electronics circuits.

Each channel of the tester includes an application specific integrated circuit (ASIC) and an associated pin electronics circuit. The ASICs, which are identical, are mounted on circuit boards, which also are identical, in groups of sixteen. Thus, ASICs 1–16 are mounted on board 1, ASICs 17–32 are mounted on board 2, and so on, ASICs 497–512 being mounted on board 32.

Referring to FIG. 2, each ASIC includes a write cache 10 having a 32-bit wide data path connected to the data bus 4 for receiving the test pattern data for the associated pin electronics circuit in 32-bit blocks each containing eight 4-bit test patterns. The 32-bit blocks are held temporarily in the cache 10 and are written into the DRAM 14 under control of an address generator or sequencer 18. The write cache 10 coordinates reading of data from the data bus with the refresh cycles of the DRAM 14. During test execution, the address generator 18 reads the test patterns from the DRAM 14 in 32-bit blocks which are written into a read cache 22 over a 32-bit wide data path. The read cache 22 coordinates reading of data from the DRAM 14 with the refresh cycles of the DRAM and the timing requirements of the pin electronics circuit.

The DRAM 14 may have a capacity of 16 megabits (Mb), so that it can supply, if necessary, a sequence of 4 M test patterns (where M represents 1,048,576) in 0.5 M 32-bit blocks. The DRAM 14 has a range of addresses $A_1$–$A_n$ and stores a single 32-bit block at each address. In a practical implementation, the DRAM 14 may be constituted by four distinct DRAM chips each having a capacity of 4 Mb and an 8-bit wide data path. Each chip has a range of addresses $A_1$–$A_n$ and stores a single 8-bit word at each address.

The read cache 22 is connected by a 32-bit wide data path to a parallel-to-serial converter 26, which converts each block of 32 bits read from the DRAM 14 and retimed by the read cache 22 to eight 4-bit nibbles which are supplied to the associated pin electronics circuit in successive test cycles within a sequence of eight test cycles, for establishing the state of the pin electronics circuit during the next cycle of the tester. For example, bits 1–4 of the 32-bit block establish the state of the pin electronics circuit in cycle 1 of the eight cycle sequence and bits 29–32 establish the state of the pin electronics circuit in cycle 8.

The 32-bit wide data path from the cache 10 to the DRAM 42 and the 32-bit wide data path from the read cache 22 to the parallel-to-serial converter 26 are selectively connected via a switch S1 to an exclusive OR tree 30 which reduces the 32-bit block supplied by the cache 10 or cache 22, depending on the state of the switch S1, to a single parity bit. The parity bit for a multi-bit block is 1 or 0 depending on whether the number of 1s in the block is odd or even.

Referring to FIG. 1, the parity bits from the sixteen ASICs on board 1 are supplied to an exclusive OR tree 44 which reduces the sixteen bits to a single parity bit. The output of the XOR tree 44, which reflects the parity of sixteen 32-bit blocks, or a total of 512 bits, is supplied to one input of a comparator 38.

The parity bits from the ASICs on board 1 are also supplied to respective switches S2. Each switch S2 selects either the parity bit of the associated ASIC or logic 0 and supplies the selected logic level to an XOR tree 36.

Each board also includes a 0.5 Mb SRAM 42 having a 1-bit wide data path and addresses $A_1$–$A_n$. An SRAM address generator 46 generates addresses for the SRAM 42. The SRAM receives the signal NOT-RUN at its write enable terminal, and therefore the contents of the SRAM can be changed during memory load.

As a preliminary step in the memory load operation, the host computer 2 generates address instructions for each board and supplies the address instructions for the board to the address generator 18 of each ASIC and to the address generator 46. The address instructions specify the sequence of addresses in the DRAM 14 to which the pattern memory data is written from the write cache 10 during memory load and the sequence of addresses used for reading the contents of the DRAM 14 and SRAM 42 during test execution. It will be assumed in the following discussion that the pattern data is written sequentially to addresses $A_1$–$A_n$ during memory load.

As a further preliminary step in memory load, the host computer issues an instruction that clears the contents of the DRAMs 14 and the SRAM 42 to zero. In this circumstance, the parity bit for each 32-bit block at an address in DRAM is zero.

Based on test set-up information, the host computer issues an instruction specifying which of the ASICs will receive data during the first cycle of the memory load operation. For example, the instruction might specify only ASICs 1 and 2. In response to this instruction, the switches S2 associated with the specified ASICs, i.e. the switches $S2_1$ and $S2_2$, select the respective parity bits and the other switches S2 select logic 0. During the first cycle of memory load, the contents of address $A_1$ of ASICs 1 and 2 may be changed from zero to one or may remain zero, but the contents of address $A_1$ of the other ASICs will remain zero. It will be appreciated that in the example under discussion the parity of address $A_1$ of ASICs 1–16 is determined completely by the contents of the address $A_1$ of ASICs 1 and 2, since the contents of address $A_1$ of ASICs 3–16 are zero and do not contribute to parity.

The host computer supplies the 32-bit blocks for address $A_1$ of the specified ASICs and loads the 32-bit blocks into the respective write caches 10. Concurrently with writing from the cache 10 to the DRAM 14, the cache 10 also supplies the 32-bit block to the XOR tree 30 via the switch S1. The XOR tree 30 reduces the 32-bit block to a single parity bit. The switches S2 associated with the specified ASICs, i.e. the switches $S2_1$ and $S2_2$ in this example, select the parity bits of the specified ASICs and the other switches S2 select logic 0, which is in fact equal to the parity bits of the unspecified ASICs. The XOR tree 36 reduces the sixteen bits supplied by the switches S2 to a single parity bit and supplies this bit to one input of an XOR gate 40. Concurrently, the SRAM bit for address $A_1$ (currently 0) is supplied to the other input of the XOR gate 40. If the single parity bit supplied by the XOR tree 36 is 1, the XOR gate 40 provides a 1 output and this value is written back into address $A_1$ of the SRAM; and if the bit supplied by the XOR tree 36 is 0, a 0 is written into address $A_1$ of the SRAM. Accordingly, after this first phase of the memory load operation, the bit stored in address $A_1$ of the SRAM matches the parity of address $A_1$ of the DRAMs of ASICs 1–16.

This operation is repeated for addresses $A_2$–$A_n$, so that the DRAMs are loaded and the contents of the SRAM 42 are dynamically updated during the memory load. For each address, the switches S2 associated with the ASICs for which the pattern data is not zero select the parity bit from the respective ASIC and the other switches S2 select 0. At the end of the memory load operation, each address of the SRAM contains the value of the parity for the corresponding address of the DRAMs of ASICs 1–16.

During test execution, each of the DRAM address generators 18 of ASICs 1–16 generates a sequence of address words within the range $A_1$–$A_n$ for reading the contents of the respective DRAMs. The SRAM address generator 46 addresses the SRAM 42 with the same sequence of address words as is used by the DRAM address generators to address the DRAMs. Consequently, the address generator 46 and the address generators 18 address the memory spaces of the DRAMs 14 and the SRAM 42 in lock step, duplicating all address increments and discontinuities due to test program execution instructions such as loop and repeat. If, on a given DRAM read cycle, the DRAM address generators select the address $A_j$, the SRAM address generator also selects the address $A_j$.

During a DRAM read cycle, the DRAM address generators read a 32-bit block from the DRAM in each ASIC. Thus, over ASICs 1–16, the DRAM address generators read 512 bits. In each ASIC, the switch S1 selects the data path from the read cache to the serial-to-parallel converter and the XOR tree 30 reduces the 32-bit block supplied by the switch S1 to a single parity bit. The sixteen parity bits supplied by ASICs 1–16 are reduced to a single bit by the XOR tree 44. In this manner, the 512 bits are reduced to a single parity bit.

The bit at the corresponding address of the SRAM 42 is supplied to the other input of the comparator 38, whose output is connected to one input of an AND gate which receives the signal RUN at its other input. In the event of a single error in the 512 bit block, which may be caused by a soft error, the output of the comparator 38 will be false and accordingly the output of the AND gate will be low. This output may be used to generate an alarm indication to warn the tester operator to take remedial action.

Regardless of the states of the switches S2 and the state of the output of the XOR gate 40 during test execution, the contents of the SRAM cannot be changed because the signal RUN is 1 and so the write enable input of the SRAM 42 is 0.

It may take several DRAM read cycles for the 512 bits read from the DRAMs of ASICs 1–16 to be reduced to a single bit at the output of the XOR tree 44, and accordingly a compensating delay element 48 is provided at the output of the SRAM 42. Alternatively, operation of the SRAM address generator 46 may by delayed relative to operation of the DRAM address generators.

It will be appreciated that comparison of the parity bit derived from the 512 bits read from ASICs 1–16 with the bit stored at the corresponding address of the SRAM will not provide a valid error indication if the test pattern data at the output of the read cache 22 was corrupted. However, the probability of an error in the test pattern data at this point is much smaller than the probability of a soft error occurring during test execution.

It may be useful for the operator to be aware of which DRAM chip caused the error message. For this purpose, the output data path of the read cache 22 may be connected to a pattern history register which will store sufficient cycles of data from the cache 22, such that when an alarm indication is generated, the test pattern data that contains the error will be available at an output of the register. The output of the address generator 18 is connected to an address history register which stores an equal number of addresses used for reading the patterns from the DRAM 14. For example, if it takes four DRAM read cycles for a block of 512 bits to be reduced to a single parity bit and compared with the corresponding bit stored in the SRAM 42 and generate an alarm indication at the output of the AND gate 34, the pattern history register need only store four consecutive blocks of test pattern data from the cache 22 on a first-in-first-out basis in order for the pattern $A_j$ to be available at the output of the history register when the AND gate 34 generates an alarm indication.

When the AND gate 34 generates an alarm indication, the address $A_j$ at the output of the address history register is captured and the pattern $P_j$ at the output of the pattern history generator is also captured. The address $A_j$ and the pattern $P_j$ are supplied to the host computer over the data bus 4 and the computer is able to determine from the address $A_j$ and the test set-up information the correct value of $P_j$ for each ASIC. The computer can therefore compare the patterns $P_j$ from the DRAMs respectively with the correct patterns and identify the chip that contains an incorrect pattern.

Figure 3:
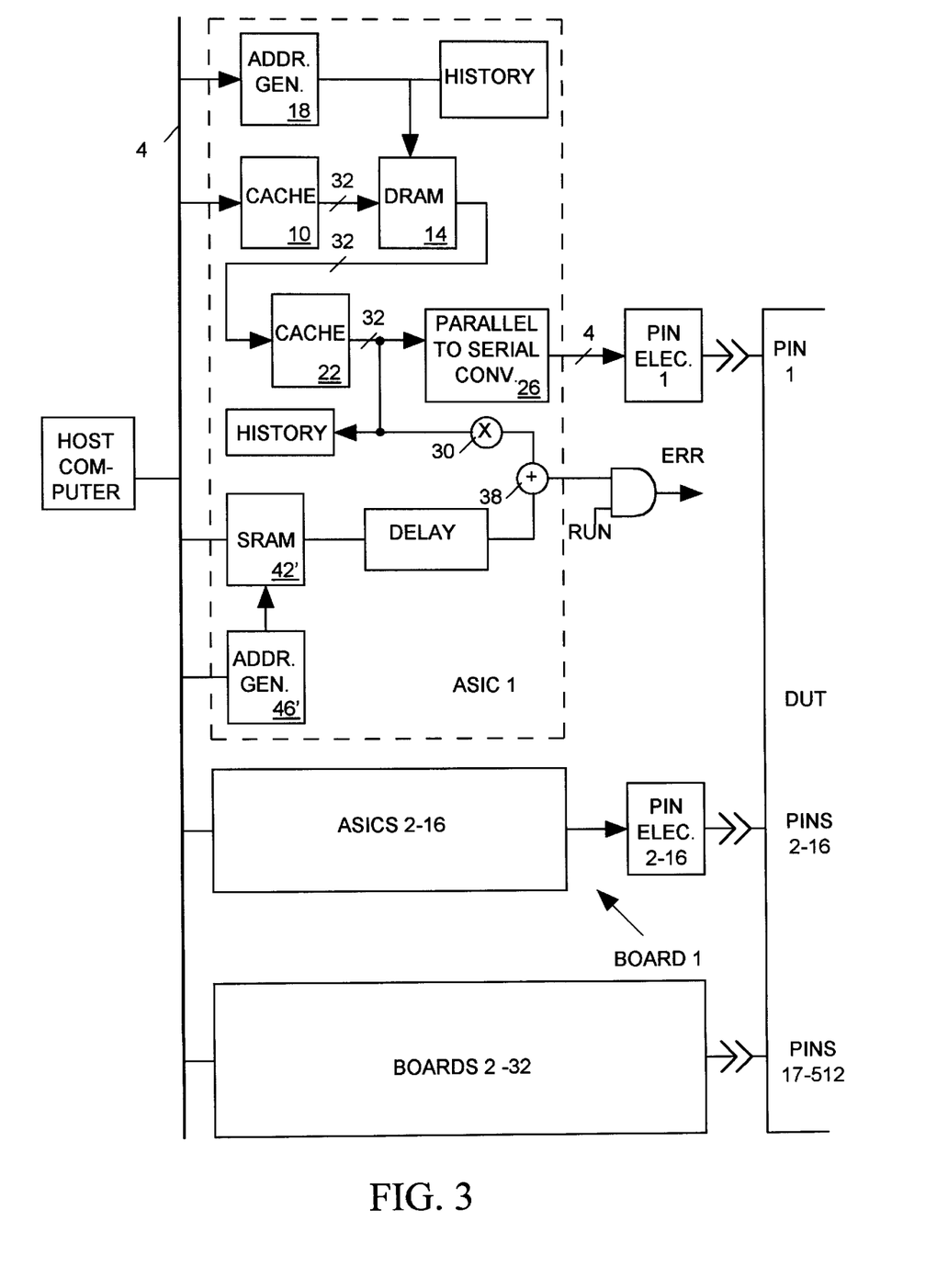
FIG. 3 is a schematic block diagram illustrating a semiconductor integrated circuit tester including a second test pattern generator in accordance with the present invention.

The arrangement described with reference to FIGS. 1 and 2 allows checking for soft errors over sixteen circuit boards. Referring to FIG. 3, in a modification of the arrangement shown in FIG. 1, an SRAM 42' and an SRAM address generator 46' may be incorporated in each ASIC, allowing checking for soft errors on a per-ASIC basis. Alternatively, it may be advantageous to carry out the parity check over a larger number of DRAM chips. For example, if the parity check is made over 8 circuit boards, it will cover 128 ASICs or 512 DRAM chips.

The DRAM 14 is shown in FIG. 2 as having separate inputs and outputs for convenience in illustrating signal flow, but it will be appreciated that in a practical implementation the DRAM would typically have a single set of pins serving as both inputs and outputs depending on the operating state of the DRAM (read or write). Further, although the read cache 10 and write cache 22 are illustrated as separate components, a single cache may be employed to coordinate both read and write operations.

It will be appreciated that the invention is not restricted to the particular embodiment that has been described, and that variations may be made therein without departing from the scope of the invention as defined in the appended claims and equivalents thereof. For example, the invention is not limited to use in an IC tester, but may be applied to soft error management in a computer.

What is claimed is:

1. A test pattern generator for a semiconductor integrated circuit tester, comprising:
   a first read/write memory for receiving and storing test pattern data in a plurality of blocks, said first read/write memory including DRAM,
   a second read/write memory for storing checking data in a plurality of units, said second read/write memory including SRAM and each unit of checking data stored in the second read/write memory bearing a predetermined relationship to a corresponding block received by the first read/write memory,
   at least one sequencer for addressing the first read/write memory for reading the blocks of test pattern data in a predetermined order and addressing the second read/write memory for reading the units of checking data from the second read/write memory, and
   a validating means for receiving a block of test pattern data read from the first read/write memory and the corresponding unit of checking data read from the second read/write memory and providing an output which indicates whether the unit of checking data is in said predetermined relationship with the block.

2. A test pattern generator according to claim 1, wherein the first read/write memory includes a DRAM timing interface for temporarily storing test pattern data being written to and read from the DRAM.

3. A test pattern generator according to claim 2, wherein the DRAM timing interface includes at least one cache.

4. A test pattern generator according to claim 1, including an interface circuit for receiving the blocks of test pattern data from the first read/write memory and providing from each block at least two sets of test pattern data bits for supplying to a pin electronics circuit in respective test cycles of the tester.

5. A test pattern generator according to claim 4, wherein the first read/write memory includes a plurality of DRAM chips.

6. A test pattern generator according to claim 5, wherein the DRAM chips each have a multi-bit data path and the multi-bit data paths are connected in parallel to the interface circuit.

7. A test pattern generator according to claim 4, wherein the first read/write memory and the interface circuit are embodied in a single application specific integrated circuit.

8. A test pattern generator according to claim 7, wherein the second read/write memory and at least part of the validating means are embodied in the application specific integrated circuit.

9. A test pattern generator according to claim 7, including a first sequencer for addressing the first read/write memory and a second sequencer for addressing the second read/write memory and wherein the first sequencer is embodied in the application specific integrated circuit.

10. A test pattern generator according to claim 1, including a first sequencer for addressing the first read/write memory and a second sequencer for addressing the second read/write memory.

11. A test pattern generator according to claim 10, wherein the first read/write memory has addresses $A_1$–$A_n$ and the second read/write memory has addresses $A_1$–$A_n$ and the first sequencer reads blocks of test pattern data from the first read/write memory within the range $A_1$–$A_n$ in a predetermined order and the second sequencer reads units of checking data from the second read/write memory within the range $A_1$–$A_n$ in said predetermined order.

12. A test pattern generator for a semiconductor integrated circuit tester, comprising:
   a first read/write memory for receiving and storing test pattern data in a plurality of blocks,
   a second read/write memory for storing checking data in a plurality of units, wherein each unit of checking data stored in the second read/write memory bears a predetermined relationship to a corresponding block received by the first read/write memory,
   at least one sequencer for addressing the first read/write memory for reading the blocks of test pattern data in a predetermined order and addressing the second read/write memory for reading the units of checking data from the second read/write memory, and
   a validating means for receiving a block of test pattern data read from the first read/write memory and the corresponding unit of checking data read from the second read/write memory and providing an output which indicates whether the unit of checking data is in said predetermined relationship with the block,
   and wherein each unit of checking data is composed of one bit and the validating means includes an XOR tree for reducing the block of test pattern data read from the first read/write memory to a single bit and a comparator for comparing said single bit with the corresponding bit of checking data.

13. A test pattern generator according to claim 12, including a history register which stores blocks of test pattern data read from the first read/write memory during a plurality of cycles on a first-in-first-out basis such that a block of data is retained in the history register at least until the comparator has compared the single bit derived from the block of data with the corresponding bit of checking data.

14. A test pattern generator for a semiconductor integrated circuit tester, comprising:
   at least first and second test pattern generator modules each including a pattern read/write memory for receiving and storing test pattern data in a plurality of blocks, the pattern read/write memory of each module including DRAM,
   a check read/write memory for storing checking data in a plurality of units, the check read/write memory including SRAM and each unit of checking data stored in the check read/write memory bearing a predetermined relationship to all the blocks stored at corresponding addresses of the pattern read/write memory of each test pattern generator module,
   at least one sequencer for addressing the pattern read/write memories of the first and second test pattern generator modules each in the same order for reading blocks of test pattern data and for addressing the check read/write memory in the same order as the pattern read/write memories for reading units of checking data from the corresponding addresses of the check read/write memory, a validating means for receiving a unit read from an address of the check read/write memory and blocks of test pattern data read from corresponding addresses of the pattern read/write memory of each test pattern generator module and providing an output which indicates whether the unit is in said predetermined relationship with the blocks.

15. A test pattern generator according to claim 14, wherein the pattern read/write memory of each module includes DRAM and a DRAM timing interface for temporarily storing test pattern data being written to and read from the DRAM.

16. A test pattern generator according to claim 15, wherein the DRAM timing interface includes at least one cache.

17. A test pattern generator according to claim 14, wherein each module includes an interface circuit for receiving the blocks of test pattern data from the pattern read/write memory and providing from each block at least one set of test pattern data bits for supplying to a pin electronics circuit in a test cycle of the tester.

18. A test pattern generator according to claim 17, wherein the interface circuit provides from each block of test pattern data at least two sets of pattern data bits for supplying to the pin electronics circuit in respective test cycles of the tester.

19. A test pattern generator according to claim 17, wherein the pattern read/write memory of each module includes a plurality of DRAM chips having a multi-bit data path connected to the interface circuit.

20. A test pattern generator according to claim 19, wherein the DRAM chips are connected in parallel to the interface circuit.

21. A test pattern generator according to claim 17, wherein the pattern read/write memory and interface circuit of each module are embodied in a single application specific integrated circuit.

22. A test pattern generator according to claim 21, wherein the check read/write memory and validating means of the module are embodied in the application specific integrated circuit.

23. A test pattern generator according to claim 21, wherein each module includes a first sequencer for addressing the pattern read/write memory and a second sequencer for addressing the check read/write memory and the first sequencer is embodied in the application specific integrated circuit.

24. A test pattern generator according to claim 14, wherein each module includes a first sequencer for addressing the pattern read/write memory and the tester includes a second sequencer for addressing the check read/write memory.

25. A test pattern generator according to claim 24, wherein the pattern read/write memory has addresses $A_1$–$A_n$ and the check read/write memory has addresses $A_1$–$A_n$ and the first sequencer reads the blocks of test pattern data from the pattern read/write memory within the range $A_1$–$A_n$ in a predetermined order and the second sequencer reads units of checking data from the check read/write memory within the range $A_1$–$A_n$ in said predetermined order.

26. A test pattern generator for a semiconductor integrated circuit tester, comprising:

at least first and second test pattern generator modules each including a pattern read/write memory for receiving and storing test pattern data in a plurality of blocks, a check read/write memory for storing checking data in a plurality of units, wherein each unit of checking data stored in the check read/write memory bears a predetermined relationship to all the blocks stored at corresponding addresses of the pattern read/write memory of each test pattern generator module, at least one sequencer for addressing the pattern read/write memories of the first and second test pattern generator modules each in the same order for reading blocks of test pattern data and for addressing the check read/write memory in the same order as the pattern read/write memories for reading units of checking data from the corresponding addresses of the check read/write memory, a validating means for receiving a unit read from an address of the check read/write memory and blocks of test pattern data read from corresponding addresses of the pattern read/write memory of each test pattern generator module and providing an output which indicates whether the unit is in said predetermined relationship with the blocks, and wherein each unit of checking data is composed of one bit and the validating means includes an XOR tree for reducing the block of test pattern data to a single bit and a comparator for comparing said single bit with the corresponding bit of checking data.

27. A test pattern generator according to claim 26, wherein each module includes a history register which stores blocks of test pattern data read from the pattern read/write memory during a plurality of cycles on a first-in-first-out basis such that a block of data is retained in the history register at least until the comparator has compared the single bit derived from the block of data with the corresponding bit of checking data.

28. A method of operating a semiconductor integrated circuit tester which includes a test pattern generator comprising a first read/write memory for storing test pattern data in a plurality of blocks, said first read/write memory including DRAM, said method comprising:

supplying test pattern data to the first read/write memory in a plurality of blocks, providing checking data in a plurality of units, wherein each unit bears a predetermined relationship to a corresponding block supplied to the first read/write memory, storing the checking data in a second read/write memory including SRAM, reading the blocks of test pattern data from the first read/write memory in a predetermined order and reading the corresponding units of checking data from the second read/write memory, comparing each block of test pattern data read from the first read/write memory with the corresponding unit of the checking data read from the second read/write memory, and providing an output which indicates whether the unit of the checking data is in said predetermined relationship with the corresponding block of test pattern data.

29. A method according to claim 28, wherein each unit of checking data is composed of a single bit and the step of comparing each block of test pattern data read from the read/write memory with the corresponding unit of checking data includes reducing the block of test pattern data to a single parity bit and comparing the parity bit with the unit of checking data.

30. A method of operating an electronic instrument including DRAM, said method comprising:

supplying data to the DRAM in a plurality of blocks, providing checking data in a plurality of units, wherein each unit bears a predetermined relationship to a corresponding block supplied to the DRAM, storing the checking data in SRAM, reading the blocks of data from the DRAM in a predetermined order and reading the corresponding units of checking data from the SRAM, comparing each block of data read from the DRAM with the corresponding unit of the checking data, and providing an output which indicates whether the unit of the checking data is in said predetermined relationship with the corresponding block of data read from the DRAM.

31. A method according to claim 30, wherein each unit of checking data is composed of a single bit.

* * * * *

UNITED STATES PATENT AND TRADEMARK OFFICE
CERTIFICATE OF CORRECTION

PATENT NO. : 6,161,206
DATED : December 12, 2000
INVENTOR(S) : Timothy M. Wasson Page 1 of 1

It is certified that error appears in the above-identified patent and that said Letters Patent is hereby corrected as shown below:

Column 9,
Line 16, (Claim 15, line 3),"DRAM and" should be deleted.

Signed and Sealed this

Eighteenth Day of September, 2001

*Attest:*

*Attesting Officer*

NICHOLAS P. GODICI
*Acting Director of the United States Patent and Trademark Office*